United States Patent [19]

Kitamura et al.

[11] Patent Number: 4,745,307
[45] Date of Patent: May 17, 1988

[54] SEMICONDUCTOR INTEGRATED CIRCUIT WITH A PROGRAMMABLE LOGIC ARRAY

[75] Inventors: Yoshishige Kitamura; Katsuya Furuki; Nobuyuki Sugiyama, all of Tokyo, Japan

[73] Assignee: NEC Corporation, Japan

[21] Appl. No.: 902,874

[22] Filed: Sep. 2, 1986

[30] Foreign Application Priority Data

Sep. 6, 1985 [JP] Japan .................. 60-197908
Oct. 25, 1985 [JP] Japan .................. 60-239709

[51] Int. Cl.$^4$ ........................ H03K 19/094
[52] U.S. Cl. .................... 307/468; 307/448; 307/303; 357/41; 357/45
[58] Field of Search .......... 307/443, 448, 451–453, 307/468–469, 303; 357/41, 45; 364/716

[56] References Cited

U.S. PATENT DOCUMENTS

| 4,356,413 | 10/1982 | Rosenbluth et al. | 307/468 X |
| 4,513,307 | 4/1985 | Brown | 357/41 X |
| 4,644,187 | 2/1987 | Haji | 307/468 X |
| 4,651,190 | 3/1987 | Suzuki et al. | 357/41 X |

OTHER PUBLICATIONS

Balasubramanian et al., "Program Logic Array With Metal Level Personalization", IBM T.D.B., vol. 19, No. 6, Nov. 1976, pp. 2144–2145.
Bansal, "Multifunction Circuit Cell", IBM T.D.B., vol. 25, No. 9, Feb. 1983, pp. 4499–4502.
Greenspan et al., "Merged AND/OR Array PLA Using Double Polysilicon FET Process", IBM T.D.B., vol. 23, No. 6, Nov. 1980, pp. 2189–2191.
Kraft et al., "Method of Personalizing Programmed Logic Arrays Using Multiple Levels of Polysilicon", IBM T.D.B., vol. 23, No. 3, Aug. 1980, pp. 881–882.

Primary Examiner—Stanley D. Miller
Assistant Examiner—D. R. Hudspeth
Attorney, Agent, or Firm—Laff, Whitesel, Conte & Saret

[57] ABSTRACT

A programmable logic array has a plurality of column units aligned parallel to each other. Each column unit consists of at least one MOSFET column, and at least one load element aligned vertically. Each MOSFET column has a plurality of MOSFETs aligned vertically. The MOSFETs have at least one common gate electrode. The MOSFETs belonging to two parallel MOSFET columns have a common linear source electrode.

8 Claims, 8 Drawing Sheets

1

SEMICONDUCTOR INTEGRATED CIRCUIT WITH A PROGRAMMABLE LOGIC ARRAY

BACKGROUND OF THE INVENTION

The present invention relates to a programmable logic array for a semiconductor integrated circuit.

FIG. 1 is a block diagram for explaining the structure of a programmable logic array (to be referred to as a PLA hereinafter) used in a conventional semiconductor integrated circuit. Referring to FIG. 1, the PLA comprises, e.g., two logic matrices, i.e., an AND matrix 1 and an OR matrix 2. An input signal 3 consisting of c data signals is input to the rows of the AND matrix 1. The AND matrix 1 outputs d product term signals 4 from its columns, and inputs them to the columns of the OR matrix 2. An output signal 5 consisting of e data signals can be obtained from the rows of the OR matrix 2.

In the conventional PLA, if the size of the circuit changes depending on the input number (c), the product term number (d), and the output number (e), its shape changes two-dimensionally. When a plurality of PLAs are arranged on a chip, gaps are often formed therebetween, thus making high integration difficult and resulting in complex connections of input/output signal lines and a power source.

SUMMARY OF THE INVENTION

It is an object of the present invention to provide a PLA which is free from the conventional drawbacks and can improve a packaging density of a semiconductor integrated circuit and simplify connections.

According to the present invention, there is provided a PLA comprising a plurality of column units aligned parallel to each other, each of the column units consisting of at least one MOSFET column and at least one load means aligned vertically, each of the MOSFET columns having a plurality of MOSFETs aligned vertically, the plurality of MOSFETs having at least one common gate electrode.

DETAILED DESCRIPTION OF THE PREFERRED EMBODIMENTS

The preferred embodiments of the present invention will now be described with reference to the accompanying drawings.

Figure 2A:
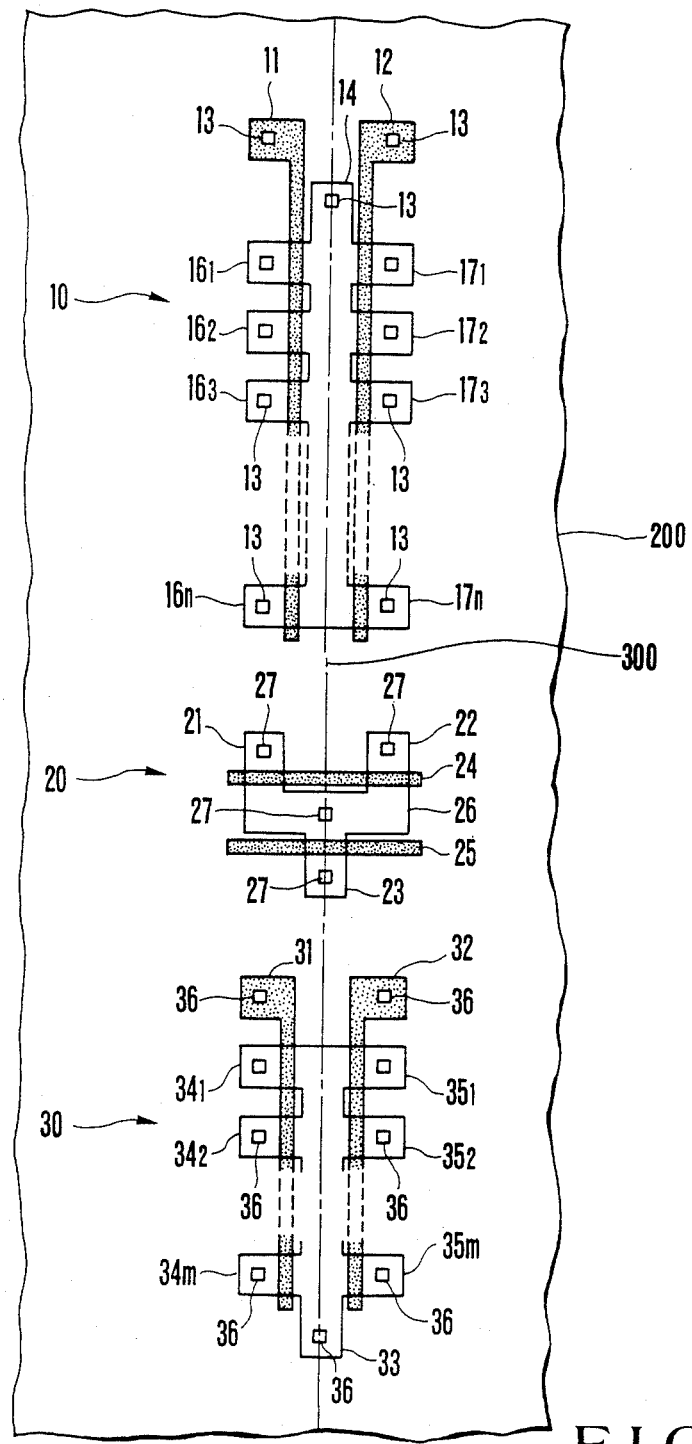
FIG. 2A is a schematic plan view of a column unit of a PLA according to a first embodiment of the present invention.
Figure 2B:
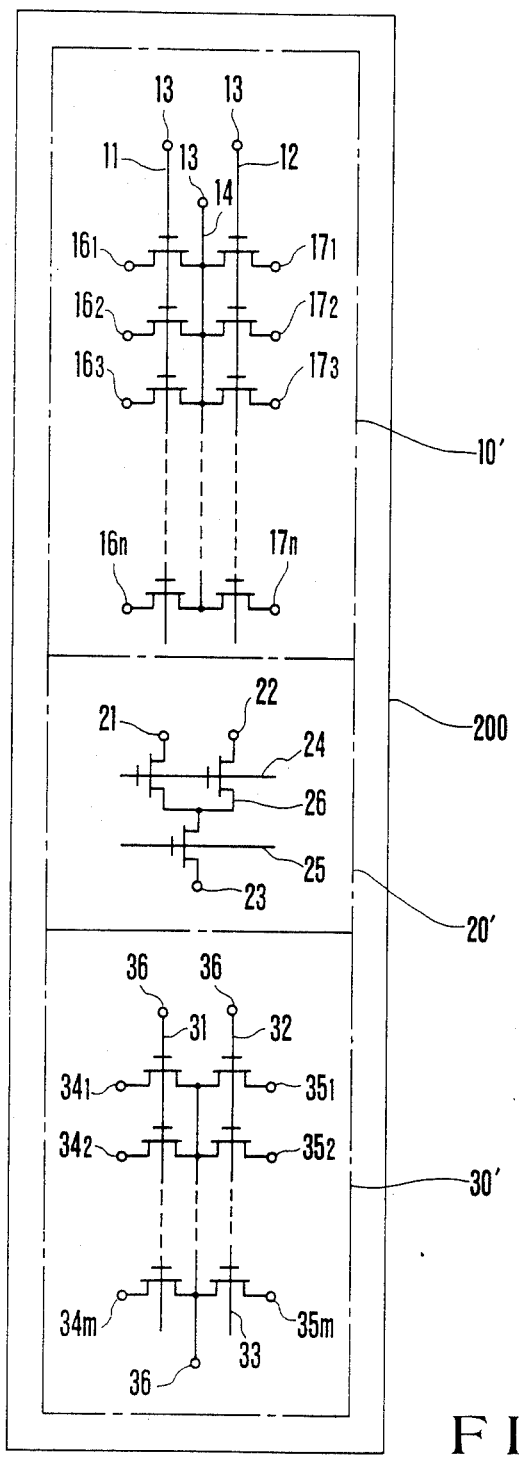
FIG. 2B is an equivalent circuit diagram of the column unit shown in FIG. 2A.

FIG. 2A is a plan view showing a column unit which consists of a MOSFET column 10, a load element 20, and a MOSFET column 30. FIG. 2B shows equivalent circuit 10', 20' and 30' of the MOSFET column 10, the load element 20, and the MOSFET column 30, respectively. The MOSFET column 10, the load element 20, and the MOSFET column 30 are linearly arranged on a substrate 200 such that vertical center lines of these elements 10, 20, and 30 are aligned on a line 300.

In the MOSFET column 10 shown in FIG. 2A, reference numerals 11 and 12 denote polysilicon common gate electrodes; 13, contact holes for connecting respective MOSFETs to wirings; 14, a common source electrode comprising a diffusion layer; and $16_1$ to $16_n$ and $17_1$ to $17_n$ (n is an integer), drain electrodes of the respective MOSFETs.

In the load element 20 shown in FIG. 2A, reference numerals 21, 22, and 23 denote drain electrodes of respective MOSFETs; 24 and 25, polysilicon common gate electrodes; 26, a common source electrode; and 27, wiring contact holes.

In the MOSFET column 30 shown in FIG. 2A, reference numerals 31 and 32 denote polysilicon common gate electrodes; 33, a common source electrode; $34_1$ to $34_m$ and $35_1$ to $35_m$ (m is an integer), drain electrodes of respective MOSFETs; and 36, wiring contact holes.

The respective portions in FIG. 2A are indicated by the same reference numerals as in the equivalent circuit diagram in FIG. 2B.

Figure 3:
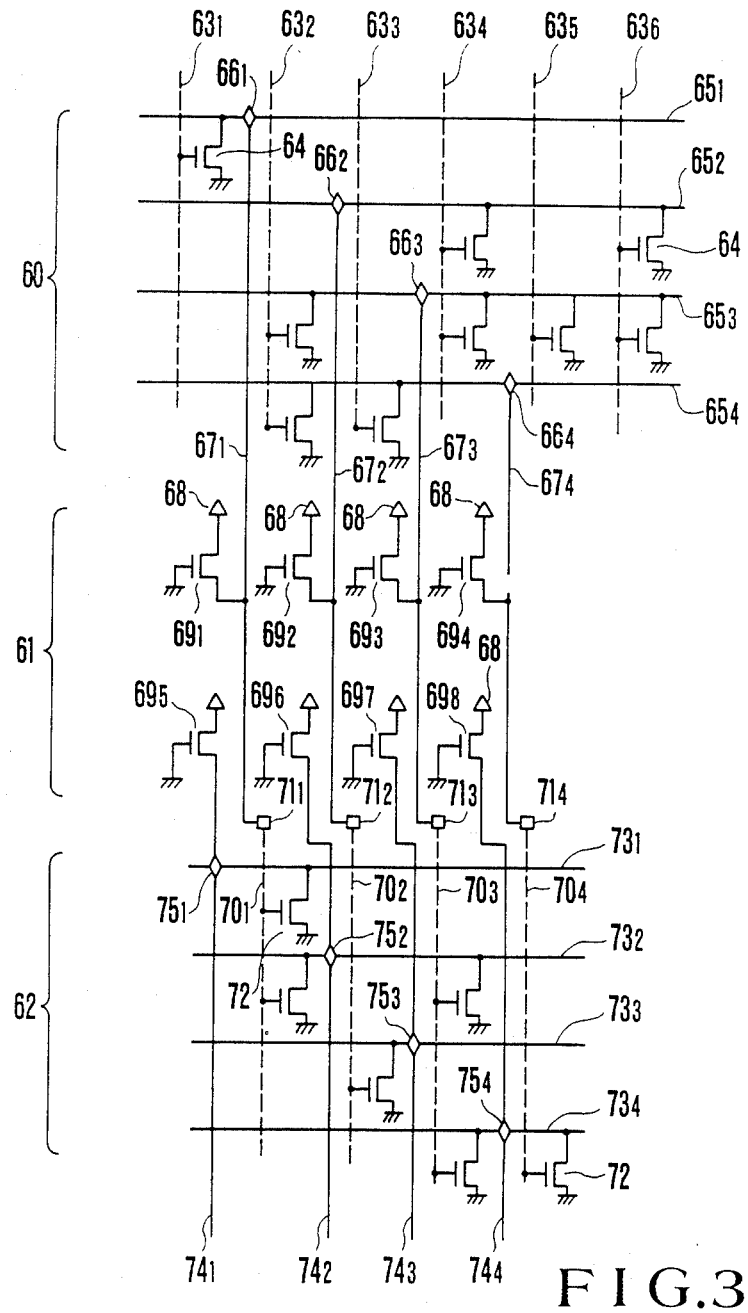
FIG. 3 is a circuit diagram of a PLA constituted by three column units of the first embodiment.

FIG. 3 shows an embodiment of a PLA in which three column units each consisting of a vertical array of the MOSFET columns 10 and 30 and the load element 20 are aligned parallel to each other and are connected through wirings.

Referring to FIG. 3, reference numeral 60 denotes an AND matrix; 61, a load unit; and 62, an OR matrix. Reference numerals $63_1$ to $63_6$ denote polysilicon input lines; 64, a plurality of NMOSFETs constituting a logic circuit in the AND matrix 60; $65_1$ to $65_4$, product term lines formed by a first aluminum layer connected to the drains of the NMOSFETs 64; $66_1$ to $66_4$, through holes for connecting the first and second aluminum layers; $67_1$ to $67_4$, product term lines formed by the second aluminum layer; 68, power source terminals; $69_1$ to $69_8$, load elements comprising PMOSFETs, the gates of which are grounded; $70_1$ to $70_4$, polysilicon input lines for the OR matrix 62; $71_1$ to $71_4$, nodes for connecting the output lines (product term lines) $67_1$ to $67_4$ of the AND matrix 60 to the corresponding input lines $70_1$ to $70_4$ of the OR matrix 62; 72, NMOSFETs constituting a logic circuit in the OR matrix 62; $73_1$ to $73_4$, output lines formed by the first aluminum layer connected to the drains of the NMOSFETs 72; $74_1$ to $74_4$, output lines formed of the second aluminum layer; and $75_1$ to $75_4$, through holes for connecting the output lines $73_1$ to $73_4$ to the corresponding output lines $74_1$ to $74_4$. It should be noted that FIG. 3 aims to reveal the electrical connections, and MOSFETs and contact holes apart from signal lines are omitted therefrom.

Figure 1:
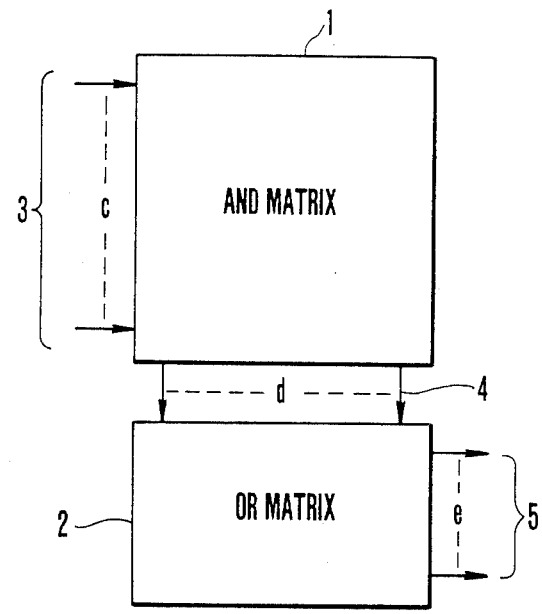
FIG. 1 is a block diagram showing the arrangement of a conventional PLA.
Figure 4:
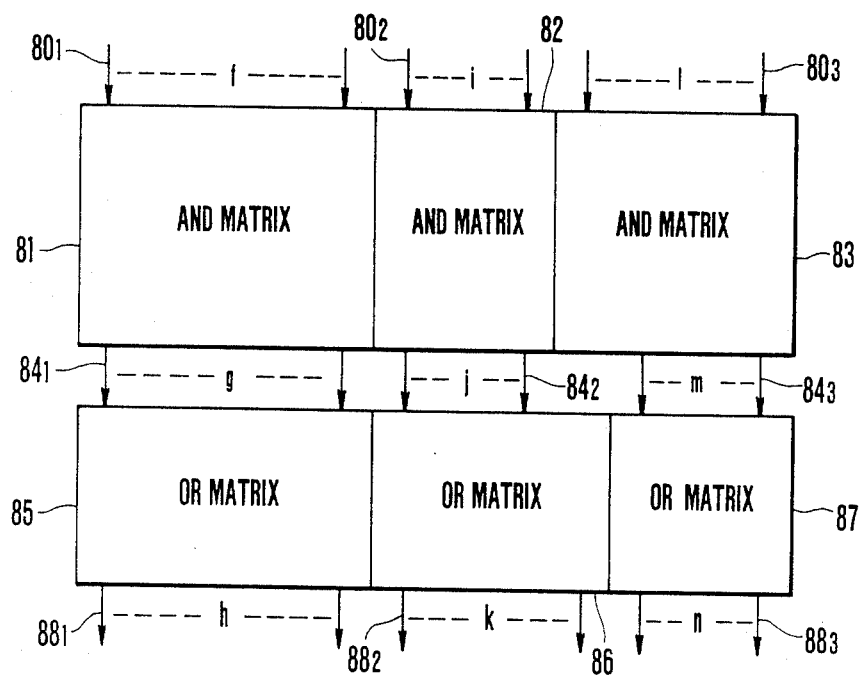
FIG. 4 is a schematic diagram of an embodiment of a semiconductor integrated circuit constituted by a plurality of PLAs in FIG. 3.

FIG. 4 is a diagram of a semiconductor integrated circuit using a plurality of PLAs. Referring to FIG. 4, reference numerals $80_1$, $80_2$, and $80_3$ denote input lines respectively consisting of f, i, and l lines; 81, 82, and 83, AND matrices connected to the input lines $80_1$, $80_2$, and $80_3$, respectively; $84_1$, $84_2$, and $84_3$, output lines (product term lines) of the AND matrices 81, 82, and 83, respectively consisting of g, i, and m lines; 85, 86, and 87, OR matrices connected to the product term lines $84_1$, $84_2$, and $84_3$, respectively; $88_1$, $88_2$, and $88_3$, output lines of the OR matrices 85, 86, and 87, respective consisting of h, k, and n lines. In FIG. 4, three PLAs are arranged adjacent to each other, and can be realized, such that the column units shown in FIG. 1 are aligned parallel to each other and two aluminum layers are formed thereon.

As described above, the column units each consisting of a vertical array of the MOSFET columns of the present invention are aligned parallel to each other to constitute a PLA with a uniform height. Therefore, when an LSI is designed using a large number of PLAs, its arrangement can be simplified and a time required for designing can be shortened. In terms of the programs of gaps between the PLAs, even if the input numbers f, i, and l of the respective PLAs are different from each other, as shown in FIG. 4, they can be aligned without forming gaps therebetween, thereby saving an occupation area of the PLAs on an integrated circuit chip. In addition, since positions of the power source lines and clock lines can be standardized, connections between the PLAs can be made with ease.

Figure 5A:
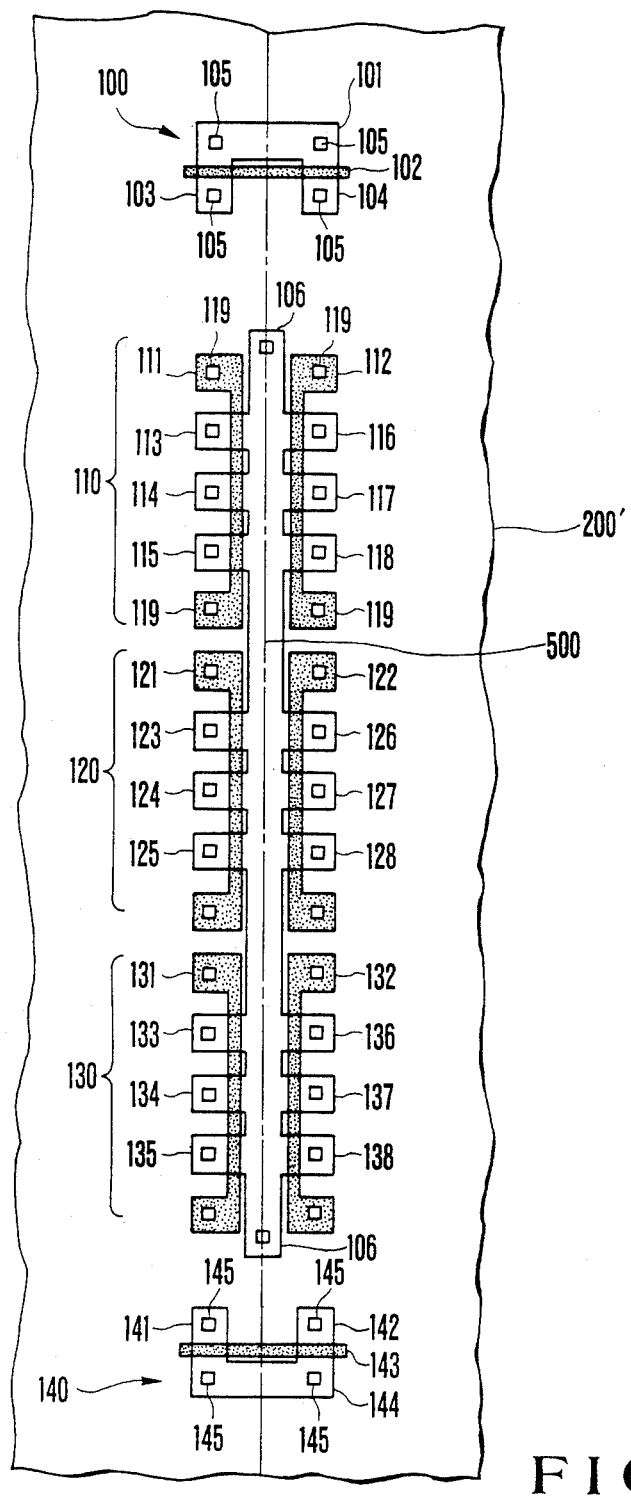
FIG. 5A is a plan view of a column unit according to a second embodiment of the present invention.

FIG. 5A is a plan view of a column unit according to another embodiment of the present invention. In FIG. 5A, however, wiring portions are not shown.

In FIG. 5A, a load element 100 comprises two MOSFETs. Reference numeral 102 denotes a common gate electrode formed of polysilicon; 103 and 104, drain electrodes of the MOSFETs; and 105, contact holes. Reference numerals 110, 120, and 130 denote MOSFET columns having the same arrangement and having a common source electrode 106. In the MOSFET column 110, reference numerals 111 and 112 denote polysilicon common gate electrodes; 113 to 118, drain electrodes of the MOSFETs; and 119, contact holes. The MOSFET columns 120 and 130 have the same arrangement as that of the MOSFET column 110. In a load element 140, reference numerals 141 and 142 denote drain electrodes; 143, a common gate electrode; 144, a common source electrode; and 145, contact holes.

The load element 100, the MOSFET columns 110, 120, and 130 connected through the common source electrode 106, and the load element 140 are vertically aligned on a center line 500, thus constituting a column unit.

Figure 5B:
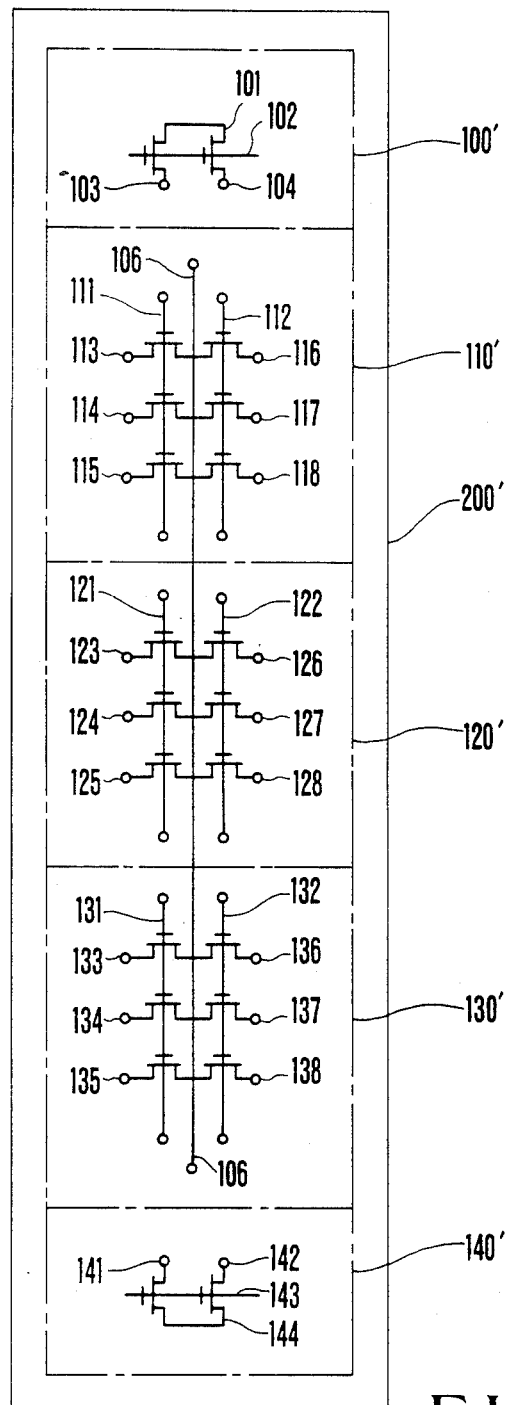
FIG. 5B is an equivalent circuit diagram of the column unit shown in FIG. 5A.

FIG. 5B shows equivalent circuits 100', 110', 120', 130', and 140' corresponding to the load element 100, the MOSFET columns 110, 120 and 130 the load element 140.

Figure 6:
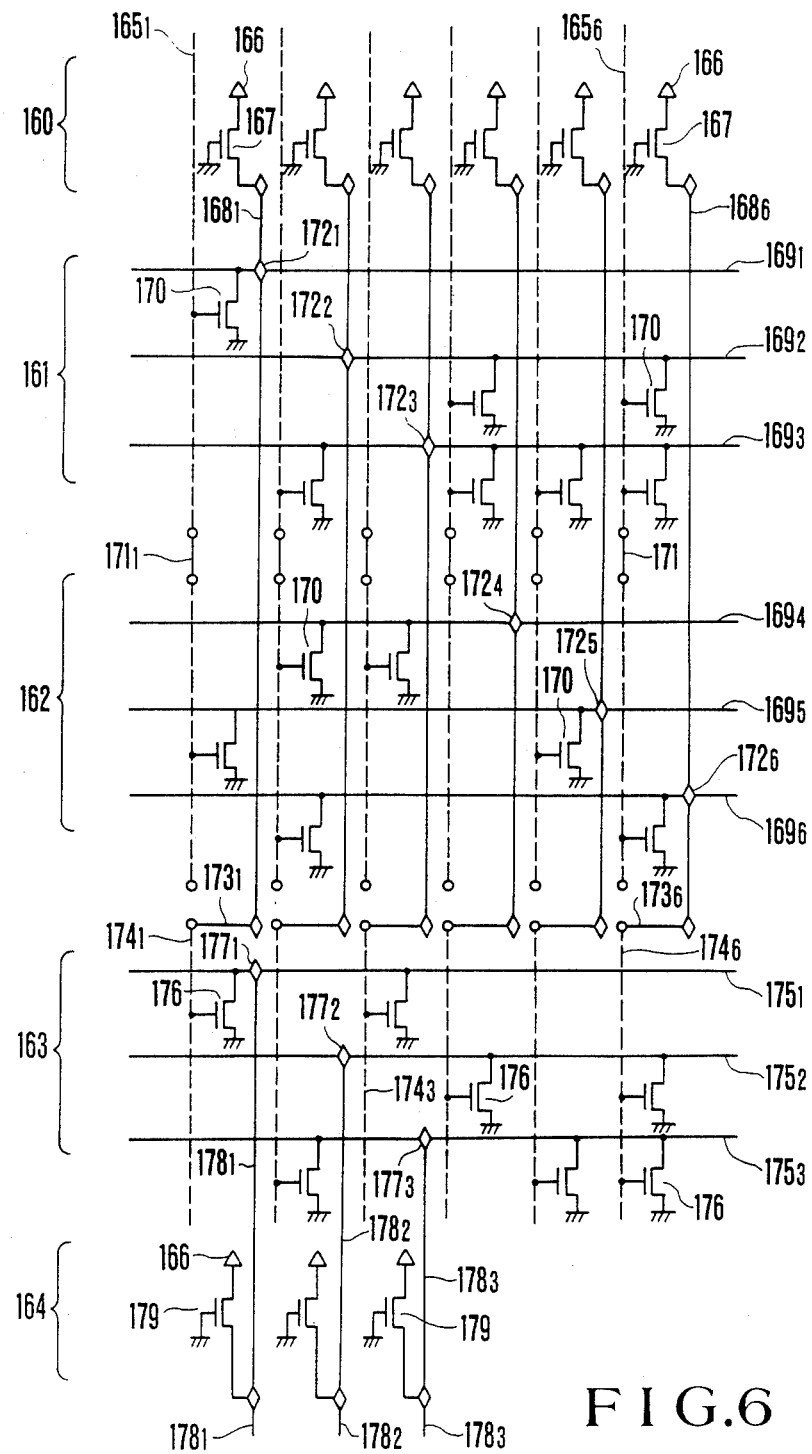
FIG. 6 is a circuit diagram of a PLA constituted by the three column units of the second embodiment.

FIG. 6 shows an embodiment of a PLA in which three column units described above are aligned parallel to each other. Referring to FIG. 6, reference numeral 160 denotes a load unit; 161 and 162, AND matrices; 163, OR matrix; 164, a load unit; $165_1$ to $165_6$, polysilicon input lines; 166, power source terminals; and 167, load elements comprising PMOSFETs, the gates of which are grounded.

In AND matrices 161 and 162, reference numerals $168_1$ to $168_6$ denote product term lines formed by a second aluminum layer; $169_1$ to $169_3$, product term lines formed by a first aluminum layer; 170, NMOSFETs constituting a logic circuit in the AND matrices 161 and 162; $171_1$ to $171_6$, connecting lines, formed by the first aluminum layer, for connecting the input lines of the AND matrices 161 and 162; $172_1$ to $172_6$, through holes for connecting the product term lines $168_1$ to $168_6$ formed by the second aluminum layer with the corresponding product term lines $169_1$ to $169_6$ formed by the first aluminum layer.

In an OR matrix 163, reference numerals $174_1$ to $174_6$ denote polysilicon input lines; $173_1$ to $173_6$, connecting lines, formed by the first aluminum layer, for connecting the product term lines $168_1$ to $168_6$ common to the AND matrices 161 and 162 with the corresponding input lines $174_1$ to $174_6$ of the OR matrix 163; $175_1$ to $175_3$, output lines formed by the first aluminum layer; 176, a plurality of NMOSFETs constituting a logic circuit in the OR matrix 163; $178_1$ to $178_3$, output lines of the OR matrix 163, formed by the second aluminum layer; and $177_1$ to $177_3$, through holes for connecting the output lines $175_1$ to $175_3$ formed by the first aluminum layer with the corresponding output lines $178_1$ to $178_3$ formed by the second aluminum layer.

Reference numeral 179 denotes load elements of the OR matrix consisting of PMOSFETs at the OR matrix side, the gates of which are grounded and which are connected to the output lines $178_1$ to $178_3$. It should be noted that FIG. 6 aims to reveal the electrical connections, and MOSFETs and contact holes apart from signal lines are omitted therefrom.

Figure 7:
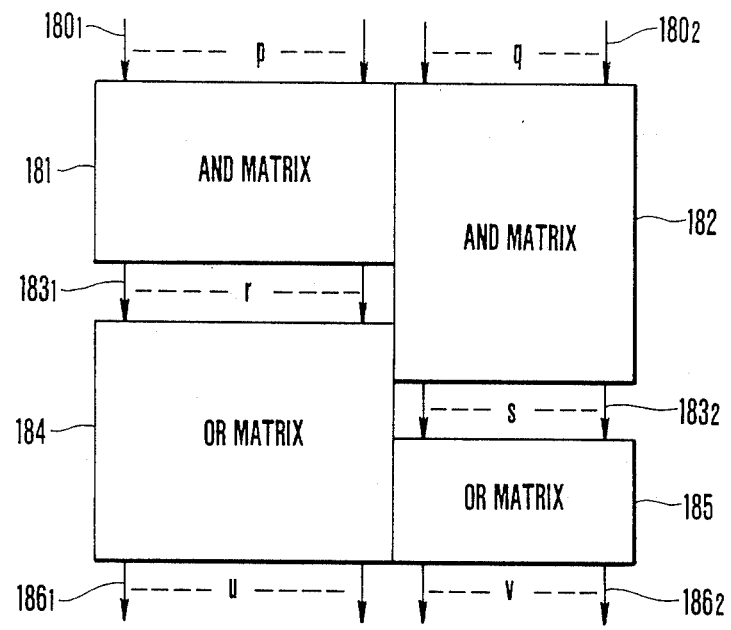
FIG. 7 is a block diagram of an embodiment of a semiconductor integrated circuit constituted by a plurality of PLAs in FIG. 6.

FIG. 7 shows an embodiment of a semiconductor integrated circuit in which two PLAs shown in FIG. 6 are arranged adjacent to each other.

Referring to FIG. 7, reference numerals 181 and 182 denote AND matrices; and 184 and 185, OR matrices. Reference numerals $181_1$ and $181_2$ denote input lines to the AND matrices 181 and 182, respectively consisting of p and q lines; $183_1$ and $183_2$, input lines to OR matrices 184 and 185, respective consisting of r and s lines; and $186_1$ and $186_2$, output lines of the OR matrices 184 and 185, respectively consisting of u and v lines. The semiconductor integrated circuit can be realized such that the column units shown in FIG. 5A are aligned parallel to each other and two aluminum layers are formed thereon. In the circuit shown in FIG. 7, in the left PLA consisting of the AND matrix 181 and the OR matrix 184, the horizontal dimension of the AND matrix 181 is defined by the number p of the input lines, and the vertical dimension of the AND matrix 181 and the horizontal dimension of the OR matrix 184 are defined by the number r of the product term lines, and the vertical dimension of the OR matrix 184 is defined by the number u of the output lines. Since the left PLA has the small number r of product term lines and has the large number u of output lines, the vertical dimension of the AND matrix 181 is short and the vertical dimension of the OR matrix 184 is long. On the other hand, in the right PLA, the maximum horizontal dimension is defined by the number q of the input lines or the number s of the product term lines. However, since the number s of the product term lines is larger than the number v of the output lines, the vertical dimension of the AND matrix 182 is longer than that of the OR matrix 185.

In the above embodiments, the PLA has been described as a pseudo CMOS circuit using NMOSs as the AND and OR matrices and PMOSs as the load element. The entire circuit can be constituted only by the NMOSs or PMOSs and can be a dynamic circuit, in which a clock signal is connected to the gate of the load element.

According to the present invention as described above, column units in which MOSFET columns are aligned vertically are aligned parallel to each other to realize a PLA with a uniform thickness. Therefore, when an LSI is designed using a large number of PLAs, the arrangement of the PLAs can be simplified and a time required for designing can be shortened. As for gaps formed between the PLAs, adjacent PLAs can be aligned without forming gaps therebetween, as shown in FIG. 7, and the number of MOSFETs of the AND and OR matrix sides can be increased or decreased as desired, thus saving an occupation area of the PLAs on an integrated circuit chip. Since the positions of power source lines and clock lines can be standardized, this allows easy connections between the PLAs.

Upon development of an integrated circuit chip, a master slice technique can be adopted, wherein a chip on which column units of the present invention are aligned is prepared in advance, and an aluminum wiring layer is formed on necessary portions in accordance with a circuit function. Therefore, a decrease in development time can be expected.

What is claimed is:

1. A programmable logic array comprising a plurality of logic matrices in which a plurality of MOSFET columns, each of which consists of a plurality of MOSFETs aligned along linear input lines, are aligned parallel to each other in accordance with a predetermined number of said input lines,
   each of said logic matrices comprising:
   linear gate electrodes commonly used by said MOSFETS of said MOSFET column as said input line;
   a first wiring layer;
   a predetermined number of first output lines formed in said first wiring layer and perpendicular to said linear gate electrodes;
   a second wiring layer;
   a predetermined number of second output lines formed in said second wiring layer and arranged to correspond to and to be perpendicular to said first output lines;
   load means connected to said second output lines; and
   a plurality of holes through which said opposing first and second output lines are respectively connected to each other,
   a source electrode of each of said MOSFETs being connected to a common potential through a contact hole, a drain electrode thereof being connected to said first output line through a contact hole, and said output lines of one logic matrix being connected to said common linear gate electrodes serving as input lines of another logic matrix.

2. A programmable logic array according to claim 1, further comprising a linear source electrode common to two columns of said MOSFETs.

3. A programmable logic array according to claim 2, wherein said common linear source electrode is grounded.

4. A programmable logic array according to claim 1, wherein said load means comprises a MOSFET circuit formed between said logic matrices.

5. A programmable logic array according to claim 1, wherein said load means are MOSFET circuits formed at two end portions of said programmable logic array.

6. A programmable logic array comprising:
   a plurality of logic matrices having input lines and output lines extending in same direction from one outside to another outside of said logic matrix, said output lines being formed on a first wiring layer and connected through a plurality of through holes to logic forming lines formed on a second wiring layer, said logic forming lines being perpendicular to said output lines;
   a plurality of MOSFETs aligned along said input lines, a gate electrode, a source electrode, and a drain electrode of each of said MOSFETs being connected to (a) one of said input lines, (b) ground through a contact hole, and (c) through a contact hole to one of said logic forming lines, respectively; and
   load means aligned with said logic matrix and connected to said output lines.

7. A programmable logic array according to claim 6, wherein said load means comprises a MOSFET circuit formed between two of said logic matrices.

8. A programmable logic array according to claim 6, wherein said load means comprises MOSFET circuits formed at two end portions of said logic matrix.

* * * * *